United States Patent
Chang et al.

(10) Patent No.: US 6,448,136 B1
(45) Date of Patent: Sep. 10, 2002

(54) METHOD OF MANUFACTURING FLASH MEMORY

(75) Inventors: Kent Kuohua Chang, Tu-Cheng; Cheng-Chen Calvin Hsueh, Taipei, both of (TW)

(73) Assignee: Macronix International Co., Ltd., Hsinchu (TW)

( * ) Notice: Subject to any disclaimer, the term of this patent is extended or adjusted under 35 U.S.C. 154(b) by 17 days.

(21) Appl. No.: 09/777,231

(22) Filed: Feb. 5, 2001

(30) Foreign Application Priority Data

Dec. 8, 2000 (TW) .......................................... 89126178

(51) Int. Cl.⁷ .......................................... H01L 21/8247
(52) U.S. Cl. ...................................... 438/257; 438/908
(58) Field of Search .............................. 438/257–267, 438/907–908; 118/719

(56) References Cited

U.S. PATENT DOCUMENTS

| 5,639,679 A | * | 6/1997 | Muramatu | .................. 438/593 |
| 6,087,249 A | * | 7/2000 | Gardner et al. | ............. 438/585 |
| 6,358,864 B1 | * | 3/2002 | Chang et al. | ................ 438/261 |

* cited by examiner

*Primary Examiner*—Richard Booth
(74) *Attorney, Agent, or Firm*—J. C. Patents

(57) ABSTRACT

A method of manufacturing flash memory. The method includes using a single wafer consecutive system process. A silicon wafer is placed inside one of the reaction chambers of a chemical vapor deposition station. Tunneling oxide layer, silicon nitride floating gate, silicon oxide layer and control gate are simultaneously formed over wafers inside the station. Breaking the vacuum inside the station and cleaning the wafer are unnecessary between various processing steps.

20 Claims, 2 Drawing Sheets

METHOD OF MANUFACTURING FLASH MEMORY

CROSS-REFERENCE TO RELATED APPLICATION

This application claims the priority benefit of Taiwan application serial no. 89126178, filed Dec. 8, 2000.

BACKGROUND OF THE INVENTION

1. Field of Invention

The present invention relates to a method of manufacturing semiconductor memory. More particularly, the present invention relates to a method of manufacturing flash memory.

2. Description of Related Art

Flash memory is a type of electrically erasable programmable read-only-memory (EEPROM). Not only can data be written into, read and erased from a flash memory, programmed data can be retained after power is cut. Hence, flash memory is a versatile electronic component that is widely used inside personal computers and electronic equipment.

The floating gate and the control gate of a typical flash memory are formed using doped polysilicon. During memory programming, electrons injected into the floating gate are evenly distributed over the entire polysilicon floating gate layer. However, if the tunneling layer underneath the polysilicon floating gate layer is defective, electrons may leak out, leading to device reliability problem.

FIG. 1 is a schematic cross-sectional view of a recently developed conventional flash memory unit. As shown in FIG. 1, the flash memory has a floating gate 104 made of silicon nitride and a control gate 108 made of polysilicon. When a voltage is applied to the control gate 108 and a source region 110 during programming, electrons will be injected from the channel region close to a drain region 112 into the floating gate 104. Since silicon nitride has good electron trapping capacity, electrons injected into the silicon nitride floating gate 104 will not be evenly distributed across the entire floating gate 104. Instead, the electrons may be trapped within a localized region following a Gaussian distribution. Because the electrons injected into the floating gate 104 are mainly collected in a localized region, this type of configuration is intrinsically less sensitive to defects in the tunneling oxide layer 102 and current leak occurs less frequently.

Another advantage of using silicon nitride to fabricate the floating gate is that electrons will only concentrate in the floating gate 104 region close to the drain 112 during programming. Voltages can be applied to the control gate 108 and the source/drain regions 110 and 112 at both ends of the control gate 108 during programming. Ultimately, a Gaussian distribution of electrons is produced in the silicon nitride floating gate 104. Hence, by changing the voltages applied to the control gate 108 and the source/drain regions 110 and 112 on each side of the control gate, electrons may be channeled into two localized regions, each having a Gaussian distribution, in the floating gate, or channeled into a single localized region with a Gaussian distribution in the floating gate, or entirely prevented from going into the floating gate and thus forming an electron-free region. Therefore, a single memory cell can have four states when silicon nitride is used to fabricate the floating gate of a flash memory unit. In other words, a flash memory cell capable of holding altogether two bits of data is produced.

The conventional process of manufacturing the 1-cell-2-bit flash memory includes placing a silicon wafer 100 into a pipe furnace to form a tunneling oxide layer 102 over the wafer 100. Thereafter, silicon nitride is deposited over the tunneling oxide layer 102 by vapor deposition to form a floating gate layer 104. The wafer 100 is again put inside the pipe furnace and silicon oxide is deposited over the floating gate layer 104 to form a dielectric layer 106. Finally, a control gate layer 108 is formed over the dielectric layer 106 by chemical vapor deposition.

In the aforementioned method, the wafer must be thoroughly cleaned to remove contaminant particles after forming the tunneling oxide layer before passing the wafer into a chemical vapor deposition chamber to form the silicon nitride floating gate, and after forming the silicon oxide dielectric layer before passing the wafer into the chemical vapor deposition chamber to form the control gate. Wafer cleaning not only increases production cost, but also extends production time and lowers productivity.

Furthermore, the tunneling oxide layer, the silicon nitride floating gate, the oxide layer and the control gate are formed in different processing stations. Since suitable vacuum conditions must be established inside a reaction chamber before carrying out each processing step, a lot of setup time is wasted and hence productivity is lowered.

In addition, since the tunneling oxide layer, the silicon nitride floating gate, the oxide layer and the control gate are formed in different processing stations, the silicon wafer is likely to be exposed to the surroundings between each processing step. Due to exposure, the chance of engendering defects is greater. Moreover, each processing station will process a batch of wafers at a time. If there are any errors in processing, the entire batch of wafers may have to be reworked or discarded.

SUMMARY OF THE INVENTION

Accordingly, one object of the present invention is to provide a method of manufacturing flash memory capable of reducing the time required to prepare the processing station for forming the various layers in the flash memory and hence increasing productivity.

A second object of the invention is to provide a method of manufacturing flash memory capable of forming the tunneling oxide layer, the silicon nitride floating gate, the oxide layer and the control gate of the flash memory without breaking the vacuum created inside a reaction chamber between each step.

A third object of the invention is to provide a method of manufacturing flash memory capable of eliminating the cleaning operation after each of the layers, including the tunneling oxide layer, the silicon nitride floating gate, the oxide layer and the control gate, is formed.

A fourth object of the invention is to provide a method of manufacturing flash memory capable of reducing defects or defect density so that yield and reliability of flash memory are increased.

A fifth object of the invention is to provide a method of manufacturing flash memory capable of reducing the amount of rework or scrap so that production cost is lowered.

To achieve these and other advantages and in accordance with the purpose of the invention, as embodied and broadly described herein, the invention provides a method of manufacturing flash memory. The method uses a single wafer consecutive processing system. A single wafer is placed inside a station for chemical vapor deposition. The reaction station has a plurality of reaction chambers. Each layer of the flash memory, including the tunneling oxide layer, the silicon nitride floating gate, the oxide layer and the control gate, is formed in a different reaction chamber.

According to the embodiment of this invention, each of the layers, including the tunneling oxide layer, the silicon nitride floating gate, the oxide layer and the control gate, is formed in one of the reaction chambers of the chemical vapor deposition station. The types of chemical vapor deposition that can be performed by the station include low-pressure chemical vapor deposition (LPCVD), atmospheric pressure chemical vapor deposition (APCVD), sub-atmospheric pressure chemical vapor deposition (SACVD), plasma-enhanced chemical vapor deposition (PECVD) and rapid thermal chemical vapor deposition (RTCVD).

The tunneling oxide layer, the silicon nitride floating gate, the oxide layer and the control gate are all formed inside the chemical vapor deposition station. Since there is no need to transfer the silicon wafer from one station to another, time setting up a station is saved and hence productivity is increased.

Since the tunneling oxide layer, the silicon nitride floating gate, the oxide layer and the control gate are all formed inside an sealed reaction chamber, there is no need to break the vacuum inside the chamber between each processing step. With less contact with environmental contaminants, fewer defects will form in the deposited films. Hence, product yield and device reliability is improved.

In addition, the various layers in the flash memory are formed using a single wafer consecutive system. If any abnormal condition is found in a particular wafer, the processing step can be terminated immediately. Only one silicon wafer needs to be scrapped or reworked at a time. Hence, compared with a conventional batch processing method, the invention is capable of reducing the quantity of defective products.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
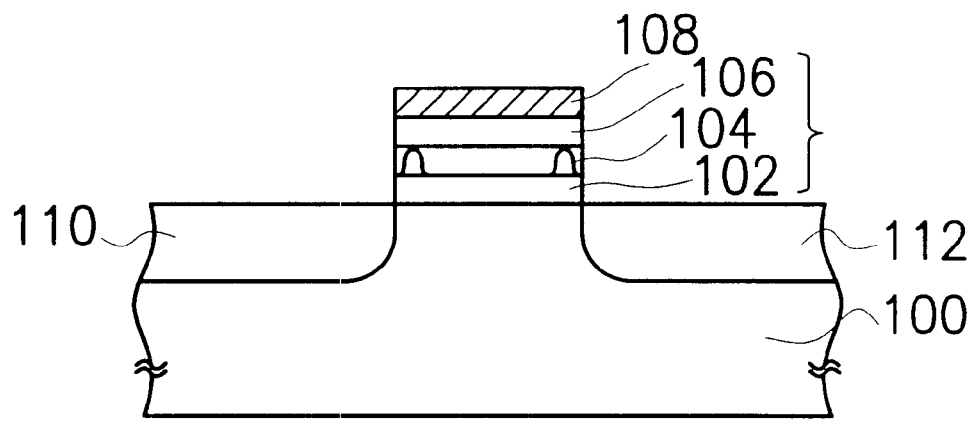
FIG. 1 is a schematic cross-sectional view of a recently developed conventional flash memory unit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
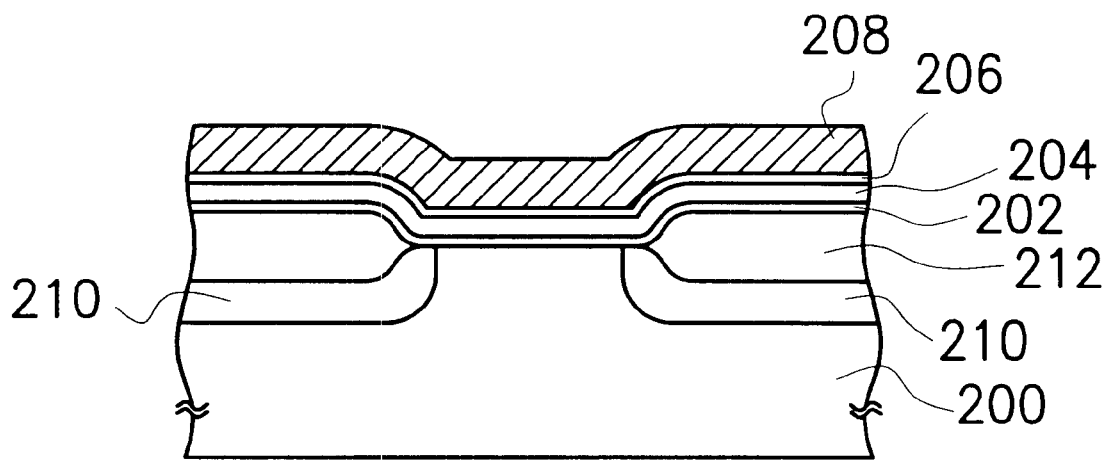
FIG. 2 is a schematic cross-sectional view of a flash memory unit fabricated according to one preferred embodiment of this invention.

FIG. 2 is a schematic cross-sectional view of a flash memory unit fabricated according to one preferred embodiment of this invention.

As shown in FIG. 2, a wafer (substrate) 200 having a buried bit line 210 and an isolation layer 212 over the buried line 210 is provided. The buried bit line 210 is formed, for example, by ion implantation. The isolation layer 212 can be formed, for example, by a local oxidation of silicon (LOCOS) method.

Figure 3:
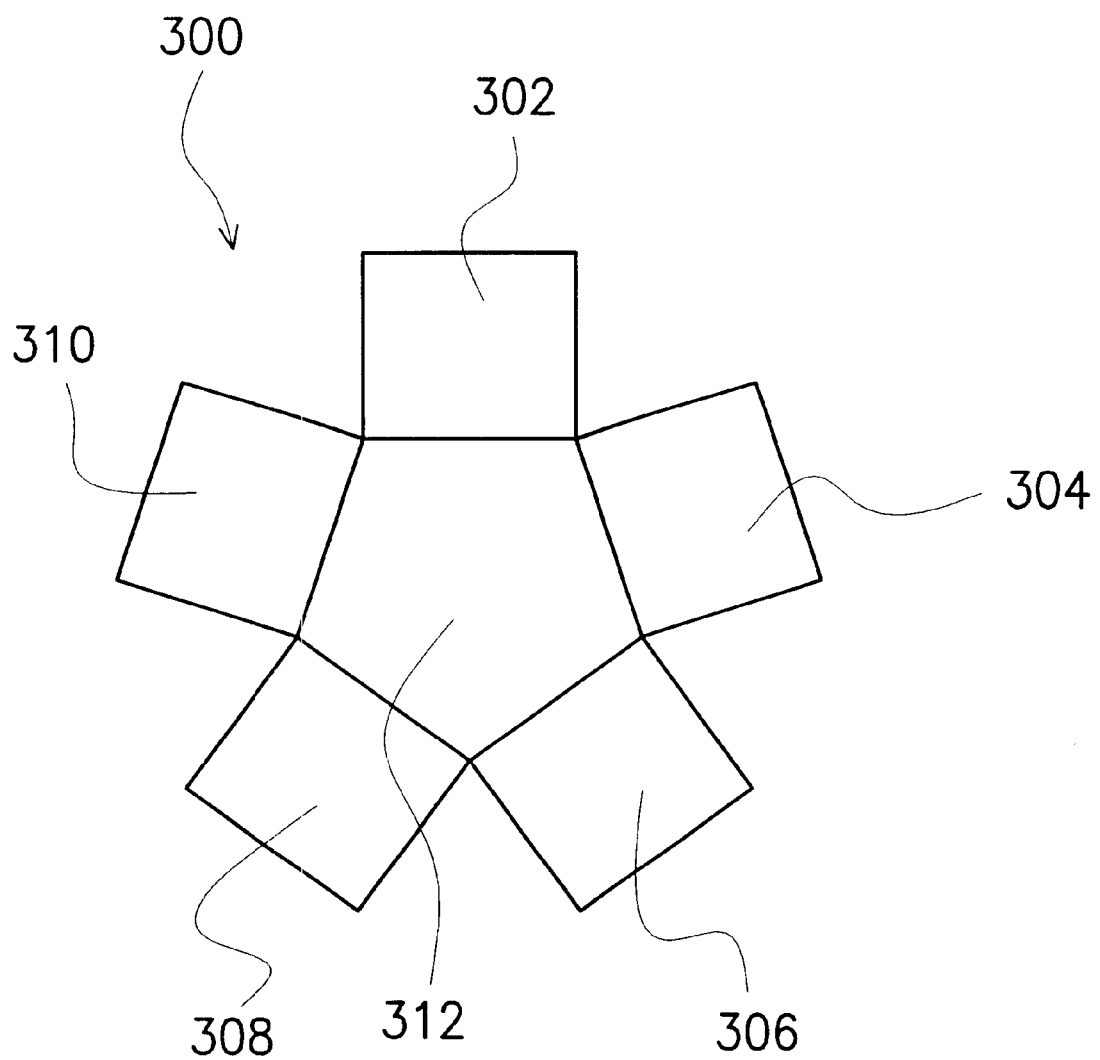
FIG. 3 is a sketch of a chemical vapor deposition station for forming flash memory according to one preferred embodiment of this invention.

The wafer 200 is put inside a chemical vapor deposition station. FIG. 3 is a sketch of a chemical vapor deposition station for forming flash memory according to one preferred embodiment of this invention. The chemical vapor deposition station 300 of this invention has a plurality of reaction chambers 302, 304, 306, 308 and 310. Each of these reaction chambers can be set to perform various types of chemical vapor depositions, including low-pressure chemical vapor deposition (LPCVD), atmospheric pressure chemical vapor deposition (APCVD), sub-atmospheric pressure chemical vapor deposition (SACVD), plasma-enhanced chemical vapor deposition (PECVD) and rapid thermal chemical vapor deposition (RTCVD). Silicon wafers 200 requiring chemical vapor deposition can be transferred from a loading dock 312 in the middle of the processing station to any one of the reaction chambers 302, 304, 306, 308, 310 by a robotic arm. At the end of a processing step, if the processing step is not final, the wafer inside a reaction chamber can simply be transferred to a neighboring chamber through the robotic arm. The internal area of the entire station is sealed. Hence, unlike the conventional method, there is no need to break the vacuum inside the reaction chamber before transferring the wafer to another station and waiting for the subsequent re-establishment of a vacuum inside the other reaction chamber.

A silicon wafer 200 is transferred to one of the reaction chambers, such as the reaction chamber 302, of the chemical vapor deposition station 300. Inside the reaction chamber 302, a chemical vapor deposition operation is conducted to form the tunneling oxide layer 202 over the wafer 200. The tunneling oxide layer 202 is formed, for example, by low-pressure chemical vapor deposition, atmospheric pressure chemical vapor deposition, sub-atmospheric chemical vapor deposition, plasma-enhanced chemical vapor deposition or rapid thermal chemical vapor deposition. Preferably, the tunneling oxide layer 202 is formed by atmospheric pressure chemical vapor deposition conducted at a temperature between 400° C. to 1200° C., a pressure between 5 to 25 torrs, ideally 10 torrs, together with the passing of hydrogen, oxygen and nitric oxide.

After forming the tunneling oxide layer 202, the robotic arm in the loading dock 312 area is employed to transfer the wafer 200 from the reaction chamber 302 into another reaction chamber 304, such as the reaction chamber 304. In the reaction chamber, the deposition of the silicon nitride floating gate layer 204 over the wafer 200 is carried out. The silicon nitride gate layer 204 is formed, for example, by low-pressure chemical vapor deposition, atmospheric pressure chemical vapor deposition, sub-atmospheric chemical vapor deposition, plasma-enhanced chemical vapor deposition or rapid thermal chemical vapor deposition. Preferably, the silicon nitride floating gate layer 204 is formed by low-pressure chemical vapor deposition conducted at a temperature between 650° C. to 750° C., a pressure between 200 to 400 torrs, ideally 275 torrs together with the passing of silane and ammonia.

After forming the silicon nitride floating gate layer 204, the robotic arm in the loading dock 312 area is again employed to transfer the wafer 200 from reaction chamber 304 into another reaction chamber, such as reaction chamber 306. In reaction chamber 306, the deposition of the silicon oxide dielectric layer 206 over the wafer 200 is carried out. The silicon oxide dielectric layer 206 is formed, for example, by low-pressure chemical vapor deposition, atmospheric pressure chemical vapor deposition, sub-atmospheric chemical vapor deposition, plasma-enhanced chemical vapor deposition or rapid thermal chemical vapor deposition. Preferably, the silicon oxide dielectric layer 206 is formed by low-pressure chemical vapor deposition conducted at a temperature between 650° C. to 750° C., a pressure between 200 to 400 torrs, ideally 275 torrs, together with the passing of silane and nitrous oxide.

Similarly, the robotic arm is used to transfer the wafer 200 from reaction chamber 306 to another reaction chamber, such as reaction chamber 308 for forming a control gate. In the reaction chamber 308, a conductive layer 208 is formed over the silicon oxide dielectric layer 206. The conductive layer 208 is formed, for example, by low-pressure chemical vapor deposition, atmospheric pressure chemical vapor deposition, sub-atmospheric chemical vapor deposition, plasma-enhanced chemical vapor deposition or rapid thermal chemical vapor deposition. The conductive layer 208 is a doped amorphous silicon layer, for example. Preferably, the conductive layer 208 is formed by low-pressure chemical vapor deposition conducted at a temperature between 550° C. to 800° C., a pressure between 200 to 400 torrs together with the passing of silane and phosphine.

In addition, the amorphous silicon conductive layer 208 may incorporate a metal silicide layer to lower electrical resistance. The metal silicide layer can be a tungsten silicide layer formed, for example, using tungsten hexafluoride and silane or tungsten hexafluoride and dichloromethane as gaseous reactants. The conductive layer 208 can also be a doped polysilicon layer, with doping and deposition conducted concurrently. Preferably, the polysilicon layer is formed by low-pressure chemical vapor deposition conducted at a temperature between 550° C. to 800° C., a pressure between 200 to 400 torrs, together with the passing of silane and phosphine.

In summary, the method of this invention uses a single wafer consecutive processing system. A single wafer is placed inside a station for chemical vapor deposition. The reaction station has a plurality of reaction chambers. Each layer of the flash memory, the tunneling oxide layer, the silicon nitride floating gate, the oxide layer and the control gate, is formed in a different reaction chamber.

The tunneling oxide layer, the silicon nitride floating gate, the oxide layer and the control gate are all formed inside the chemical vapor deposition station. Since there is no transfer of silicon wafers from one station to another, time setting up a station is saved and hence productivity is increased.

Since the tunneling oxide layer, the silicon nitride floating gate, the oxide layer and the control gate are all formed inside a sealed reaction chamber, there is no need to break the vacuum inside the chamber between each processing step. With less contact with environmental contaminants, fewer defects will form in the deposited films. Hence, product yield and device reliability is improved.

In addition, various layers in flash memory are formed using a single wafer consecutive system. If any abnormal condition is found in a particular wafer, the processing step can be terminated immediately. Only one silicon wafer needs to be scrapped or reworked at a time. Hence, compared with a conventional batch processing method, the invention is capable of reducing the quantity of defective products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing flash memory, comprising the steps of:

providing a chemical vapor deposition station having a plurality of reaction chambers therein;

placing a silicon wafer inside one of the reaction chambers and forming a tunneling oxide layer over the wafer;

transferring the silicon wafer to another reaction chamber and forming a silicon nitride layer over the tunneling oxide layer, wherein the silicon nitride layer serves as a floating gate;

transferring the silicon wafer to another reaction chamber and forming a silicon oxide layer over the silicon nitride layer, wherein the silicon oxide layer serves as a dielectric layer between the floating gate and a control gate; and transferring the silicon wafer to another reaction chamber and forming a conductive layer over the silicon oxide layer, wherein the conductive layer serves as a control gate.

2. The method of claim 1, wherein the tunneling oxide layer, the silicon nitride layer, the silicon oxide layer and the conductive layer are formed in a single wafer consecutive system.

3. The method of claim 1, wherein each of the layers, including the tunneling oxide layer, the silicon nitride layer, the oxide layer and the conductive layer, are formed inside one of the reaction chambers of the chemical vapor deposition station using one of the methods including low-pressure chemical vapor deposition, atmospheric pressure chemical vapor deposition, sub-atmospheric pressure chemical vapor deposition, plasma-enhanced chemical vapor deposition and rapid thermal chemical vapor deposition.

4. The method of claim 3, wherein the wafer remains isolated from the surroundings in an almost vacuum state inside the chemical vapor deposition station during chemical deposition and between the process of forming the tunneling oxide layer, the silicon nitride layer, the silicon oxide layer and the conductive layer.

5. The method of claim 1, wherein no cleaning of the wafer is necessary from the step of forming the tunneling oxide layer to the step of forming the conductive layer.

6. The method of claim 1, wherein the step of forming the tunneling oxide layer includes an atmospheric chemical vapor deposition conducted at a temperature between 400° C. to 1200° C., a pressure between 5 to 25 torrs, together with the passing of hydrogen, oxygen and nitric oxide.

7. The method of claim 1, wherein the step of forming the silicon nitride layer includes a low-pressure chemical vapor deposition conducted at a temperature between 650° C. to 750° C., a pressure between 200 to 400 torrs, together with the passing of silane and ammonia.

8. The method of claim 1, wherein the step of forming the silicon oxide layer includes a low-pressure chemical vapor deposition conducted at a temperature between 650° C. to 750° C., a pressure between 200 to 400 torrs, together with the passing of silane and nitrous oxide.

9. The method of claim 1, wherein the conductive layer includes a doped amorphous silicon layer such that the doping and depositing are conducted concurrently.

10. The method of claim 9, wherein the step of forming the conductive layer includes a low-pressure chemical vapor deposition conducted at a temperature between 550° C. to 800° C., a pressure between 200 to 400 torrs, together with the passing of silane and phosphine to form a doped amorphous silicon layer.

11. The method of claim 9, wherein after the step of forming the conductive layer, further includes forming a metal silicide layer over the conductive layer.

12. The method of claim 11, wherein the metal silicide layer includes a tungsten silicide layer formed using tungsten hexafluoride and silane as gaseous reactants.

13. The method of claim 11, wherein the metal silicide layer is formed using tungsten hexafluoride and dichloromethane as gaseous reactants.

14. The method of claim 1, wherein the conductive layer includes a doped polysilicon layer such that doping and depositing are conducted concurrently.

15. The method of claim 14, wherein the step of forming the conductive layer includes a low-pressure chemical vapor deposition conducted at a temperature between 550° C. to 800° C., a pressure between 200 to 400 torrs, together with the passing of silane and phosphine to form a doped polysilicon layer.

16. A method of manufacturing flash memory, wherein the flash memory has a tunneling oxide layer, a floating gate, an oxide layer and a control gate, comprising the steps of:

providing a chemical vapor deposition station having a plurality of reaction chambers therein;

placing a silicon wafer inside one of the reaction chambers and using a single wafer consecutive system method to form the tunneling oxide layer, the floating gate, the oxide layer and the control gate inside the reaction chambers.

17. The method of claim 16, wherein the wafer remains isolated from the surroundings in an almost vacuum state inside the chemical vapor deposition station between the process of forming the tunneling oxide layer, the floating gate, the oxide layer and the control gate.

18. The method of claim 16, wherein no cleaning of the wafer is necessary from the step of forming the tunneling oxide layer to the step of forming the conductive layer.

19. The method of claim 16, wherein each of the layers, including the tunneling oxide layer, the floating gate, the oxide layer and the control gate, are formed inside one of the reaction chambers of the chemical vapor deposition station using one of the methods including low-pressure chemical vapor deposition, atmospheric pressure chemical vapor deposition, sub-atmospheric pressure chemical vapor deposition, plasma-enhanced chemical vapor deposition and rapid thermal chemical vapor deposition.

20. The method of claim 16, wherein material constituting the floating gate includes silicon nitride.

* * * * *